United States Patent
Shimada et al.

[11] Patent Number: 5,923,546
[45] Date of Patent: Jul. 13, 1999

[54] CONTROL CIRCUIT AND METHOD FOR DRIVING AND CONTROLLING PARASITIC VIBRATION OF A PIEZOELECTRIC TRANSFORMER-INVERTER

[75] Inventors: Yasuhei Shimada; Shingo Kawashima, both of Tokyo, Japan

[73] Assignee: NEC Corporation, Tokyo, Japan

[21] Appl. No.: 08/917,108

[22] Filed: Aug. 25, 1997

[30] Foreign Application Priority Data

Aug. 23, 1996 [JP] Japan ................................. 8-222335

[51] Int. Cl.⁶ .................................................. H02M 1/12
[52] U.S. Cl. ............................... 363/40; 363/97; 363/131
[58] Field of Search .............................. 310/318; 363/15, 363/16, 39, 40, 95, 97, 131

[56] References Cited

U.S. PATENT DOCUMENTS

| | | | |
|---|---|---|---|
| 5,548,189 | 8/1996 | Williams ................................. | 363/133 |
| 5,654,605 | 8/1997 | Kawashima ............................. | 310/318 |
| 5,675,484 | 10/1997 | Shimada ................................. | 363/97 |
| 5,705,877 | 1/1998 | Shimada ................................. | 310/318 |
| 5,705,879 | 1/1998 | Abe et al. ............................... | 310/316 |
| 5,731,652 | 3/1998 | Shimada ................................. | 310/316 |
| 5,739,622 | 4/1998 | Zaitsu ..................................... | 310/317 |
| 5,739,679 | 4/1998 | Takehara et al. ....................... | 363/131 |
| 5,751,092 | 5/1998 | Abe ........................................ | 310/316 |

FOREIGN PATENT DOCUMENTS

| | | | |
|---|---|---|---|
| 61-177163 | 8/1986 | Japan ............................. | H02M 3/28 |
| 8-10767 | 4/1996 | Japan ............................. | H02M 3/24 |
| 9-107684 | 4/1997 | Japan ............................. | H02M 3/24 |

*Primary Examiner*—Jeffrey Sterrett
*Attorney, Agent, or Firm*—Sughrue, Mion, Zinn, Macpeak & Seas, PLLC

[57] ABSTRACT

A piezoelectric transformer is driven with the PWM driving method by means of a driving voltage with a waveform obtained by time-dividing a first frequency with a binary pulse of a second frequency lower than the first frequency. A harmonic component of said second frequency component contained in said first frequency component can be suppressed by decreasing a slope of an envelope of said driving voltage waveform. A parasitic vibration of the piezoelectric transformer in the piezoelectric transformer-inverter controlled with the PWM system can be suppressed by controlling such inverter as described above and construction of the piezoelectric transformer support mechanism can be simplified.

11 Claims, 15 Drawing Sheets

CONTROL CIRCUIT AND METHOD FOR DRIVING AND CONTROLLING PARASITIC VIBRATION OF A PIEZOELECTRIC TRANSFORMER-INVERTER

BACKGROUND OF THE INVENTION

1. Field of the Invention

The present invention relates to a piezoelectric transformer-inverter which generates an AC voltage by using a piezoelectric transformer and its control circuit as well as its driving method, and particularly to a piezoelectric transformer-inverter optimal to adjust the brightness of a backlighting cold cathode fluorescent lamp for a color liquid crystal display and its control circuit and its driving method.

2. Description of the Prior Art

A piezoelectric transformer is a voltage converting element which generates mechanical oscillation by means of an AC voltage applied to an electrode on the primary side by using the piezoelectric effect of a piezoelectric element and takes out the resulting voltage from an electrode on the secondary side. Compared with an electromagnetic transformer, a piezoelectric transformer has such advantage that it is compact in size and thin in thickness. It is a noteworthy element which can be used as an inverter to ignite a cold cathode fluorescent lamp and as a high voltage power supply.

FIG. 1A shows a schematic perspective diagram of a piezoelectric transformer of third-order Rosen type. A piezoelectric transformer 1 comprises a strip-shaped piezoelectric ceramic plate 1d, a primary electrode 1a, and a secondary electrode 1b. The primary electrode 1a is polarized in a vertical direction. The secondary electrode 1b is longitudinally polarized. In FIG. 1A, an arrow P shows the polarization direction. When an AC voltage $V_d$ is applied to the primary electrode 1a, it oscillates in a vertical direction. Such oscillation generates a longitudinal oscillation of compressional wave. As a result, the piezoelectric ceramic plate 1d oscillates at a resonance frequency depending on a sound velocity and a shape. As a result, the voltage on the secondary electrode 1b can be stepped up in proportion to the thickness of the piezoelectric ceramic plate 1d and a distance between both electrodes. FIG. 1B shows an equivalent circuit of the piezoelectric transformer 1. As shown in FIG. 1B, a driving voltage $V_d$ supplied through a driving circuit 5 is stepped up by means of the piezoelectric transformer 1 and sent to a load 2 as a voltage $V_O$.

A ratio to the output voltage $V_O$ and the driving voltage $V_d$ corresponds to a step-up ratio of the piezoelectric transformer 1. Meanwhile, the piezoelectric transformer 1 is characterized that the step-up ratio is raised at a range of the resonance frequency as shown in FIG. 11 because the piezoelectric transformer 1 is operated by using resonance. It is also known that the step-up ratio and the resonance frequency of the piezolelectric transformer 1 change on the basis of impedance of the load 2.

In the case of a piezoelectric transformer-inverter using such piezoelectric transformer, it is desirable to achieve a wide brightness adjustment range in the brightness adjustment of a cold cathode fluorescent lamp while suppressing the occurrence of an audible sound. For example, in the case of a backlight for a 9.4 inches color liquid crystal display panel, it is necessary to output an AC wave of about $500V_{rms}$ in a tube voltage and about 5 $mA_{rms}$ in a tube current for a cold cathode fluorescent lamp of 220 mm in length and 3 mmφ in diameter as a load. On the other hand, the higher the resonance frequency is, the smaller the physical shape of the piezoelectric transformer becomes. So it is preferable to set a driving frequency at about 100 kHz. If a conductive reflector, etc. is arranged around the cold cathode fluorescent lamp, a stray capacity is formed between the AC current flowing through such lamp and the reflector. Therefore, a great current flows and a brightness is high on a high voltage side of the cold cathode fluorescent lamp, but the current is less and the brightness is uneven on a low voltage side because of a current flowing through the stray capacity in the lamp.

With the increase of a driving frequency and with the decrease of the current flowing through the lamp, this problem becomes worse and worse. To solve this problem, a PWM (Pulse Width Modulation) system is used to adjust the brightness. This is a method to vary the brightness of a cold cathode fluorescent lamp equivalently by turning on and off such lamp in such a quick period that the eyes could not sense flickering.

Japanese Patent Application Laid-open No.8-107678 (1996) filed by the assignee of the present invention discloses one of brightness adjustment techniques by this method. FIG. 2 shows a block diagram of a circuit configuration for driving a piezoelectric transformer disclosed in such patent application. As shown in this FIG. 2, in this circuit, the primary electrode 1a of the piezoelectric transformer 1 is driven with the AC voltage $V_d$ by means of the driving circuit 5, and a stepped-up AC voltage $V_O$ is applied from the secondary electrode 1b of the piezoelectric transformer to the load 2 such as a cold cathode fluorescent lamp. The output current $i_o$ flowing through the load 2 is sent to a load current comparing circuit 3 to be compared with a reference voltage $V_{ref}$. If such output current $i_o$ is lower than the reference value $V_{ref}$, the load current comparing circuit 3 sends out to a frequency sweep oscillator 4 a signal that directs the frequency sweep oscillator 4 so as to decrease a driving frequency for the driving circuit 5. In this case, the driving frequency is basically set in a frequency range higher than a frequency for making the step-up ratio on a maximum rate according to frequency characteristic shown in FIG. 11. Therefore, to decrease the driving frequency generates a decrease of the step-up ratio whereby the output current $i_o$ is increased. If such output current $i_o$ is greater than the reference value $V_{ref}$, the load current comparing circuit 3 sends out to the frequency sweep oscillator 4 a signal that directs the frequency sweep oscillator 4 so as to increase the driving frequency for the driving circuit 5. That is, the frequency sweep oscillator 4 sends out a driving signal which increases and decreases the value of a desired output current $i_o$ with respect to a generated driving frequency for the driving circuit 5. Since the driving circuit 5 drives the piezoelectric transformer 1 in accordance with such signal, the output current $i_o$ from the load 2 is kept at a predetermined value.

The frequency sweep oscillator 4 can set the uppermost and lowermost limits of the sweep frequency of a signal to be sent to the driving circuit 5. By so doing, the driving frequency of the piezoelectric transformer 1 which is outputted from the driving circuit 5 is limited between its uppermost and lowermost values. When the output current $i_o$ does not reach the predetermined value for a certain period, the driving frequency is reduced to the lowermost limit. Therefore, the driving frequency is swept up to the uppermost limit in a short period by a high-speed frequency sweep and then swept down to the lowermost limit again gradually. As described above, by controlling the driving frequency of the piezoelectric transformer 1, and by changing its voltage step-up ratio, the predetermined output voltage $V_O$ can be supplied to the load 2.

The brightness adjusting circuit 6 generates a frequency of several hundred Hz which is considerably lower than the driving frequency of the piezoelectric transformer 1 and does not give a flickering effect to the eyes. This circuit outputs a binary brightness adjusting signal the duty ratio of which changes in proportion to an input brightness adjusting voltage. When the brightness adjusting signal level becomes high, the driving circuit 5 stops the driving operation of the piezoelectric transformer 1 and stops the supply of the load current. The frequency sweep oscillator 4 operates so as to maintain the driving frequency constant while the output current does not flow. When the brightness adjusting signal level becomes low and the driving circuit 5 starts the driving operation of the piezoelectric transformer 1, the frequency sweep oscillator 4 operates so as to maintain the output current $i_o$ constant.

FIG. 3 shows an operation waveform of the above-mentioned brightness adjusting method. As shown in FIG. 3, the brightness adjusting signal is changed over to high and low levels at a period of several hundred Hz. When the brightness adjusting signal level is high, the piezoelectric transformer 1 does not output the driving voltage $V_d$, so both output voltage $V_O$ and the output current $i_o$ are not supplied. To maximize the brightness of the cold cathode fluorescent lamp (in this figure, the load 2), it is necessary to set the brightness adjusting signal level low always. Conversely, to lower such brightness, it is necessary to keep the brightness adjusting signal level high for a longer period. As described above, the brightness of the cold cathode fluorescent lamp can be adjusted by changing the period of the current supply to the load, namely, the cold cathode fluorescent lamp, by varying the duty ratio of the output signal from the brightness adjusting circuit 6.

Japanese Patent Application Laid-open No.9-107684 (1997) field by the assignee of the present invention discloses a combination of the above-mentioned brightness adjusting circuit and the driving circuit shown in FIG. 2 incorporating a voltage control circuit which absorbs a fluctuation of an input voltage $V_{DD}$ so as to keep the driving voltage $V_d$ of the piezoelectric transformer 1 constant in spite of the change of a DC input voltage $V_{DD}$. FIG. 4 is a block diagram of a circuit configuration for driving a piezoelectric transformer disclosed in such patent application. However, in FIG. 4, some sections, names, symbols, etc., of the block diagram disclosed in such patent application are changed for the purpose of comparing such circuit configuration with that of one embodiment of the present invention described later.

The driving circuit for the piezoelectric transformer 1 shown in FIG. 4 comprises four large circuit blocks, namely, a load current comparing circuit 3 and a frequency sweep oscillator 4 which detect the current $i_o$ flowing through the load 2 or the voltage $V_O$ across the load 2 connected with the secondary electrode 1b of the piezoelectric transformer 1, compare such current or voltage with a predetermined value $V_{ref}$, and control the driving frequency of the piezoelectric transformer 1 to maintain the current $i_o$ and the voltage $V_O$ constant; a voltage step-up circuit 8 which generates an AC voltage of the driving frequency from the DC input voltage $V_{DD}$ in accordance with a driving signal from the above-mentioned current comparator 3 and frequency sweep oscillator 4 and applies such AC voltage to the primary electrode 1a of the piezoelectric transformer 1; a driving voltage controlling circuit 70 which keeps the driving voltage in the form of a sine wave to be applied to the piezoelectric transformer at a predetermined value in spite of a fluctuation of the DC input voltage $V_{DD}$; and a brightness adjusting circuit 6 which controls the current flowing through the load 2 with the PWM. This circuit configuration basically corresponds to a combination of the conventional circuit configuration according to the prior art shown in FIG. 2 and the driving voltage control circuit 70. The driving circuit 5 shown in FIG. 2 comprises the step-up circuit 8 and the driving voltage control circuit 70. This driving voltage control circuit 70 absorbs the change of the input voltage $V_{DD}$ and keeps the driving voltage of the piezoelectric transformer 1 (the voltage to be applied to the primary electrode 1a) constant.

The configuration and the operation of each circuit block shown in FIG. 4 will be described in detail later in the description of the embodiments of the present invention, so such description is omitted here.

Japanese Patent Application Laid-open No.61-177163 (1986) discloses a power supply equipped with a soft start circuit as the know-how relating to one of the objects of the present invention, namely the suppression of the audible sound when turning on the power. However, such invention does not directly relate to an inverter using a piezoelectric transformer. The power supply disclosed in such patent application is so configured that a ringing choke converter of self oscillation type can perform soft start to suppress the audible sound when turning on the power. This circuit configuration will be described below with reference to FIG. 5A.

The control circuit 109 limits the base current of a transistor 108 and subtracts a value proportional to the received brightness level of a phototransistor 118 from a value proportional to the winding voltage of a feedback winding 123. The phototransistor 118 and a light emitting diode 117 form a photocoupler. When the power is turned on and the output voltage $V_O$ is increasing, a capacitor 115 is charged with the current flowing through the light emitting diode 117, resistor 104 and diode 113 and with the current from a resistor 102. When the light amount of the light emitting diode 117 is large, the control circuit 109 decreases the width of the turning on operation of the transistor 108. When the capacitor 115 is charged, an operational amplifier 110 keeps the output voltage $V_O$ constant by means of a voltage stabilizing circuit which operates according to a reference voltage 116. Thus, as shown in FIG. 5B, by the addition of the soft start circuit (comprising the resistors 102, 103, 104, diodes 112 and 113, and capacitor 115), the load becomes light and the audible sound duration is shortened. As shown in FIG. 5C, the output voltage $V_O$ increases gradually.

The brightness adjusting art disclosed in the above-mentioned Japanese Patent Application Laid-open No.8-107678 (1996) has disadvantages given below. The first disadvantage is that even though the piezoelectric transformer 1 is driven at the frequency of about 100 KHz above the audible frequency range, if such transformer starts and stops the operation repeatedly in order to adjust brightness at a period of several hundred Hz, it produces an audible sound. This is because the driving voltage applied to the piezoelectric transformer 1 becomes a tone burst wave like the driving voltage $V_d$ shown in FIG. 3 if brightness is adjusted with the PWM system. Such waveform is a sine wave but contains broad frequency component in addition to the driving frequency component at the start and stop of the driving operation because the sine wave is periodically modulated with 0 voltage. The piezoelectric transformer 1 produces a parasitic vibration with many nodes as well as an vibration with three nodes N shown in FIG. 1A. The piezoelectric transformer 1 vibrates at the three nodes N because the piezoelectric transformer 1 resonances according to the driving frequency which produces a resonance in third order longitudinal mode. Therefore, there may be other resonance frequencies by which the piezoelectric transformer 1 is resonated, for example in quintic or septimal mode. Moreover, transversal vibration may be also generated. When the piezoelectric transformer 1 is driven by the tone burst wave which contains a driving frequency component other than the driving frequency in third-order longitudinal mode, this driving frequency component produces a parastic vibration of the piezoelectric transformer 1. In the case of this piezoelectric transformer of third-order Rosen type, it is possible to support it with less mechanical loss by physically supporting three nodes N. However, when the above-mentioned brightness adjusting art is employed, the vibration is momentarily disturbed at the start and stop of the driving operation. In this case, such vibration is transmitted to the support mechanism 25 of the piezoelectric transformer 1. As a result, the piezoelectric transformer 1 and its support mechanism 25 vibrate and produce the audible sound.

The second disadvantage is that it is difficult to design the support mechanism 25 for supporting the nodes N so that the piezoelectric transformer 1 can vibrate freely. Because such transformer 1 and support mechanism 25 are mounted on a circuit base plate of an inverter, so it is difficult to predict the physical period of its entire vibration prior to the design. It is also very difficult to prevent a resonance frequency of the support mechanism 25 including the circuit base plate from resonating with the parasitic vibration of the piezoelectric transformer 1.

The third disadvantage is that it is impossible to apply the audible sound prevention know-how by means of the soft start disclosed in Japanese Patent Application Laid-open No.61-177163 (1986) to the piezoelectric transformer. In the case of the know-how described in the above-mentioned patent application, the output voltage for a converter which outputs a DC voltage increases gradually to charge a smoothening capacitor. As a result, the load becomes light when turning on the power and the decrease of the self oscillation frequency of the ringing choke system into the audible range can be prevented. However, if an inverter outputs an AC voltage and controls the driving frequency so as to drive it in a frequency range above an audible range, and if a cold cathode ray tube whose load impedance changes suddenly at the start and stop of discharge is connected as a load, it is difficult to increase the output voltage gradually. In addition, moreover, as a load impedance becomes high just before the cold cathode fluourescent lamp starts discharge, a step-ratio of the piezoelectric transformer 1 becomes high as shown in FIG. 11 whereby a output voltage from the piezolelectric transformer 1 becomes high. Therefore, if a piezoelectric transformer whose step-up ratio changes greatly due to the load impedance is used, its control becomes more difficult.

The invention disclosed in the above-mentioned Japan Patent Application Laid-open No.9-107684 (1997) has the same disadvantages.

SUMMARY OF THE INVENTION

It is an object of the present invention to solve the above-mentioned problems and to decrease the production of the audible sound of a piezoelectric transformer-inverter which is controlled with the PWM system.

It is another object of the present invention to simplify the construction of the support mechanism of a piezoelectric transformer in order to improve its manufacturability and to achieve cost reduction.

It is further another object of the present invention to provide a compact and lightweight piezoelectric transformer which is suitable for being incorporated in an integrated circuit.

According to the present invention, to achieve the above-mentioned objects, a piezoelectric transformer is driven with the PWM driving method by means of a driving voltage having a waveform obtaining by time-dividing a first frequency with a binary pulse of a second frequency lower than the first frequency. In this case, the harmonics of said second frequency component contained in said first frequency component is suppressed by decreasing the slope of the envelope of said driving voltage waveform.

Also according to the present invention, the circuit for controlling the piezoelectric transformer-inverter comprises the driving circuit for driving such piezoelectric transformer with an AC voltage of a first frequency derived from a DC voltage externally supplied; the frequency sweep oscillator for determining the driving frequency of said driving circuit; the load current comparing circuit for determining the frequency sweep direction of said frequency sweep oscillator by comparing the output current from said piezoelectric transformer with the reference value; the duty variable pulse oscillator for time-division driving said transformer with a second frequency. In such piezoelectric transformer-inverter control circuit, to suppress the harmonics of said second frequency component contained in said first frequency component, an envelope generating circuit is installed to decrease the slope of the envelope of said driving voltage waveform, and said piezoelectric transformer is driven with the driving voltage modulated in said envelope generation circuit.

As described above, according to the present invention, in the inverter for driving the piezoelectric transformer with the PWM system, the harmonic component of the duty variable pulse frequency for time division contained in the driving voltage can be decreased by the envelope generating circuit. By so doing, the parasitic oscillation of the piezoelectric transformer can be suppressed and the vibration at the nodes can be decreased. In addition, the production of the audible sound of such transformer can be suppressed to minimum.

When such effects of the present invention are applied especially to the ignition of a cold cathode fluorescent lamp for backlighting a liquid crystal display panel and when its brightness is adjusted with the PWM system, such marked advantage as wider brightness adjustable range can be obtained.

Therefore, a waveform such as a trapezoidal waveform or an exponential function waveform can be used as the envelope waveform of the driving voltage waveform which is generated in said envelope generating circuit.

To generate said trapezoidal waveform, a waveform shaping circuit for generating a trapezoidal waveform by the constant charge/discharge of a capacitor and an integrating circuit are installed in said envelope generating circuit, and a trapezoidal waveform generated by said waveform shaping circuit is modulated into the driving voltage of said first frequency by means of said integrating circuit. In this case, a current mirror circuit as a constant current circuit is suitable for being incorporated in an IC for fixing such circuit.

To generate said exponential function waveform, a waveform shaping circuit for generating an exponential function waveform by a resistor and a capacitor and an integrating circuit are installed in said envelope generation circuit, and a exponential function waveform generated by said waveform shaping circuit is modulated into the driving voltage of said first frequency by means of said integrating circuit.

An envelope generating circuit of the same configuration can change the envelope of the driving voltage by modifying the setting of the constants of resistor(s) and capacitor(s). Since the driving voltage waveform can be adjusted by changing the setting of the constant(s) without changing the circuit configuration in spite of the change of the piezoelectric transformer support mechanism and in spite of the change of the audible sound generation level. As a result, the circuit configuration can be fixed. Therefore, the driving circuit can be easily incorporated in an IC and more compact inverter may be achieved.

If the piezoelectric transformer-inverter equipped with the piezoelectric transformer and the control circuit for said transformer-inverter includes the support mechanism for said piezoelectric transformer, and if said support mechanism supports the nodes of said transformer and has a resonance frequency different from the integral multiples and integral quotients of the first frequency for driving said transformer, it is possible to prevent a resonance in the audible range and to simplify the construction of the support mechanism. Therefore, its manufacturability can be improved and its cost reduction can be achieved.

DETAILED DESCRIPTION OF PREFERRED EMBODIMENTS

The embodiments of the present invention will be described below with reference to the accompanied drawings.

Figure 6:
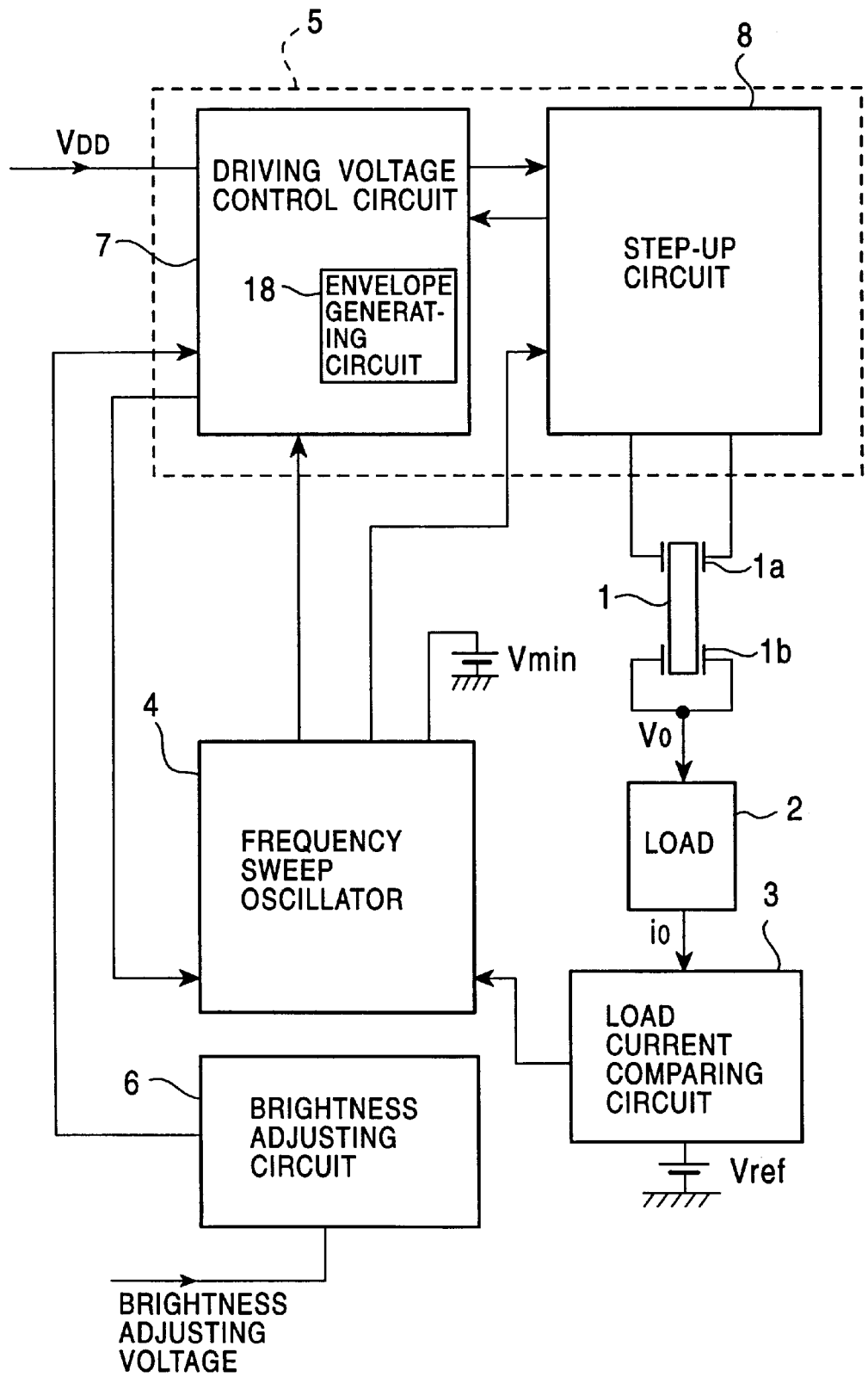
FIG. 6 shows a schematic circuit configuration of an embodiment of the piezoelectric transformer according to the present invention.

The outline of the circuit configuration of one embodiment of the piezoelectric transformer-inverter according to the present invention will be described with reference to FIG. 6. As shown in FIG. 6, the circuit configuration of this embodiment is roughly divided into four circuit blocks, namely, a load current comparing circuit 3, a frequency sweep oscillator 4, a driving circuit 5 and a brightness adjusting circuit 6. In this circuit configuration, a primary electrode 1a of the piezoelectric transformer 1 is driven with an AC voltage from the driving circuit 5, and an AC voltage $V_O$ is applied to a load 2 from a secondary electrode 1b of such transformer. The load current comparing circuit 3 rectifies the current $i_o$ from the load 2 connected with the secondary electrode 1b of such transformer, compares the resulting rectified current with the reference value $V_{ref}$, and outputs a control signal for increasing and decreasing the driving frequency of the transformer 1 to the frequency sweep oscillator 4. The frequency sweep oscillator 4 generates the driving frequency for the piezoelectric transformer 1 in accordance with a control signal from the load current comparing circuit 3. The driving circuit 5 receives the DC voltage $V_{DD}$, and generates an AC voltage for driving the primary electrode 1a of the transformer 1 in accordance with the driving frequency from the frequency sweep oscillator 4. The brightness adjusting circuit 6 generates a pulse of the PWM system out of the received brightness adjusting voltage and turns on and off the driving circuit 5 periodically. By so doing, the brightness of a cold cathode fluorescent lamp as the load 2 can be controlled.

Figure 1A:
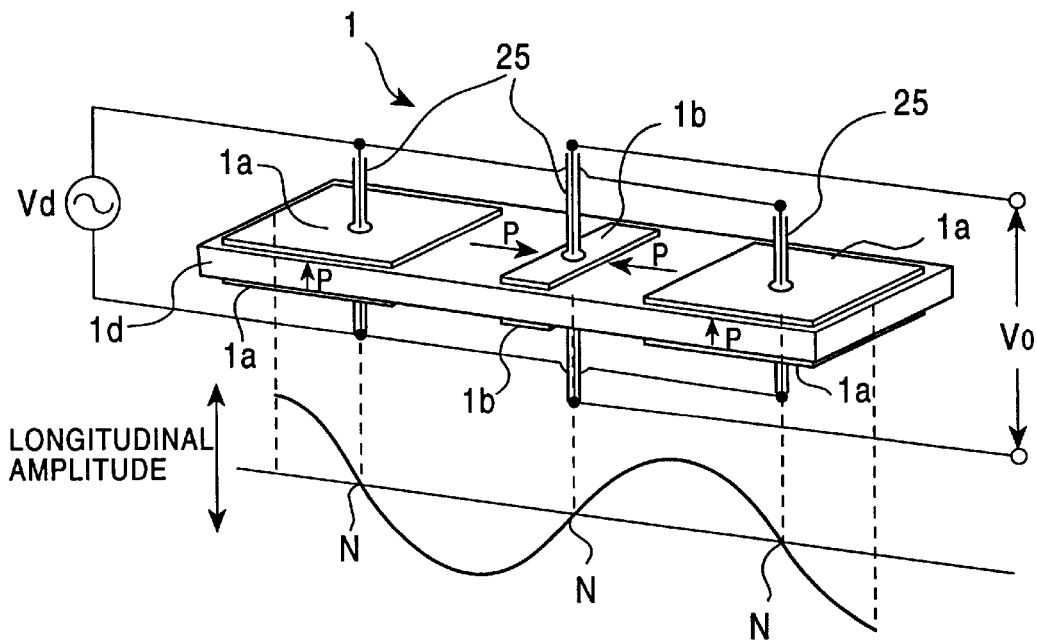
FIG. 1A shows a schematic perspective diagram of the piezoelectric transformer of third-order Rosen type.
Figure 1B:
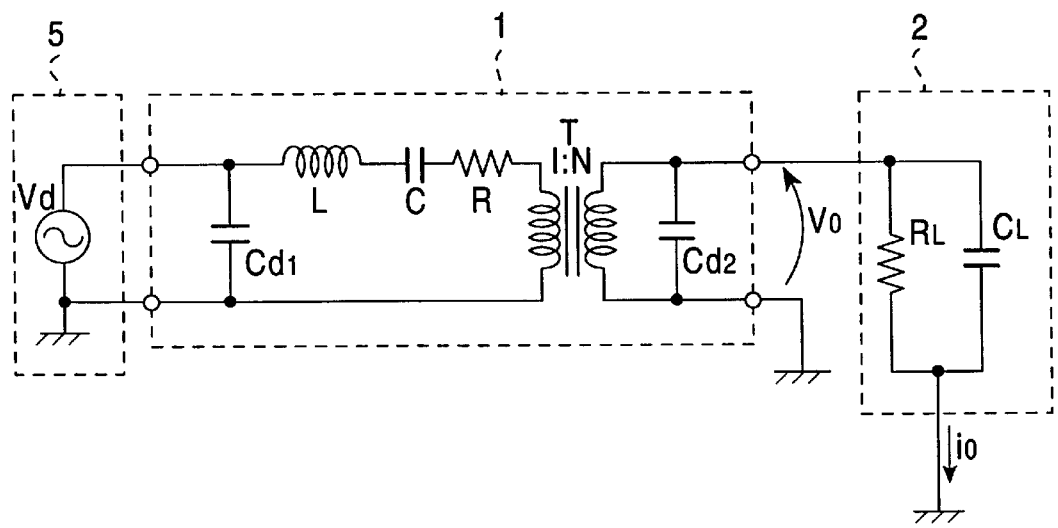
FIG. 1B shows the equivalent circuit of the transformer of FIG. 1A.
Figure 4:
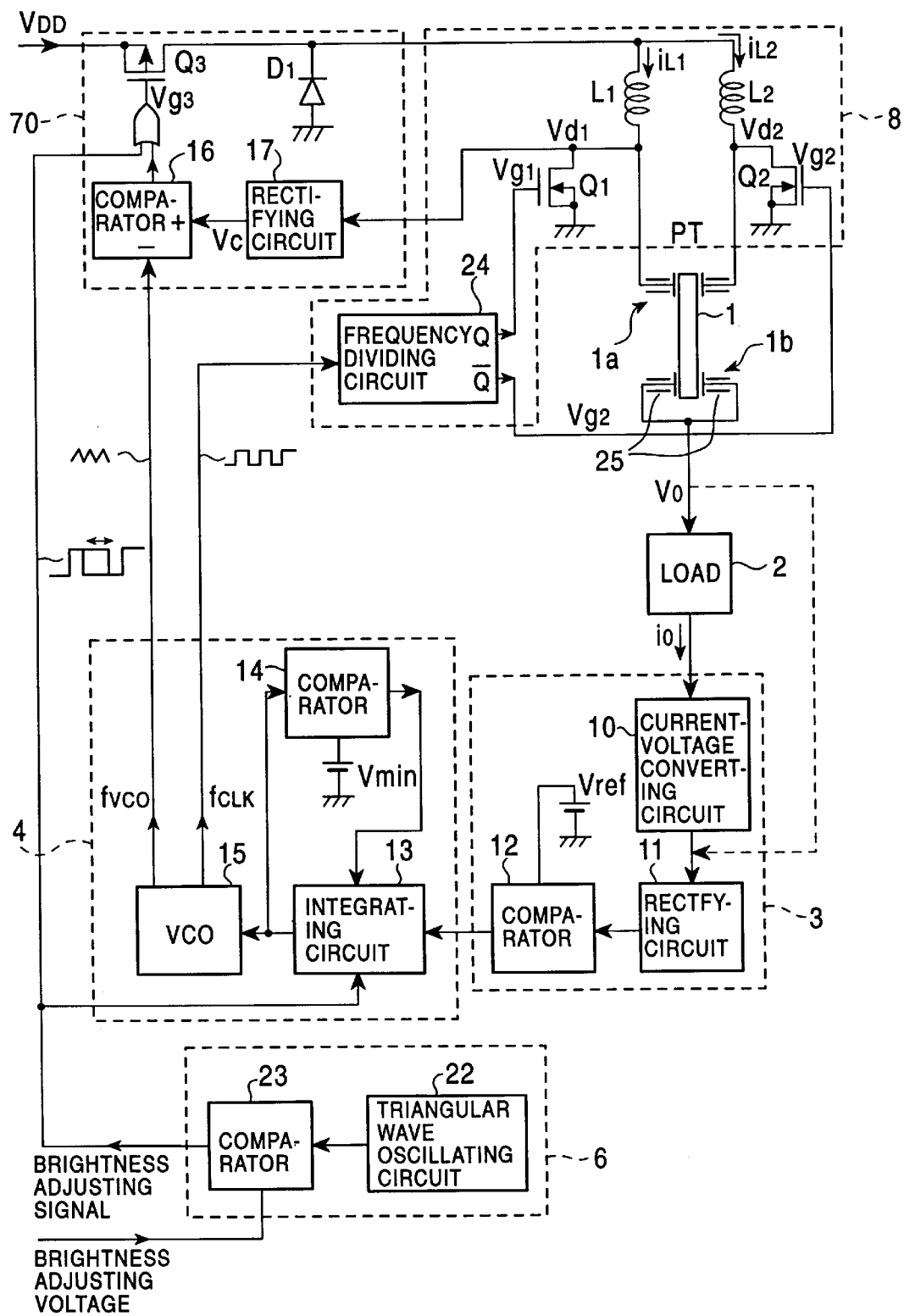
FIG. 4 shows a block diagram of the circuit diagram for driving the piezoelectric transformer disclosed in Japanese Patent Application Laid-open No.9-107684 (1997).
Figure 5A:
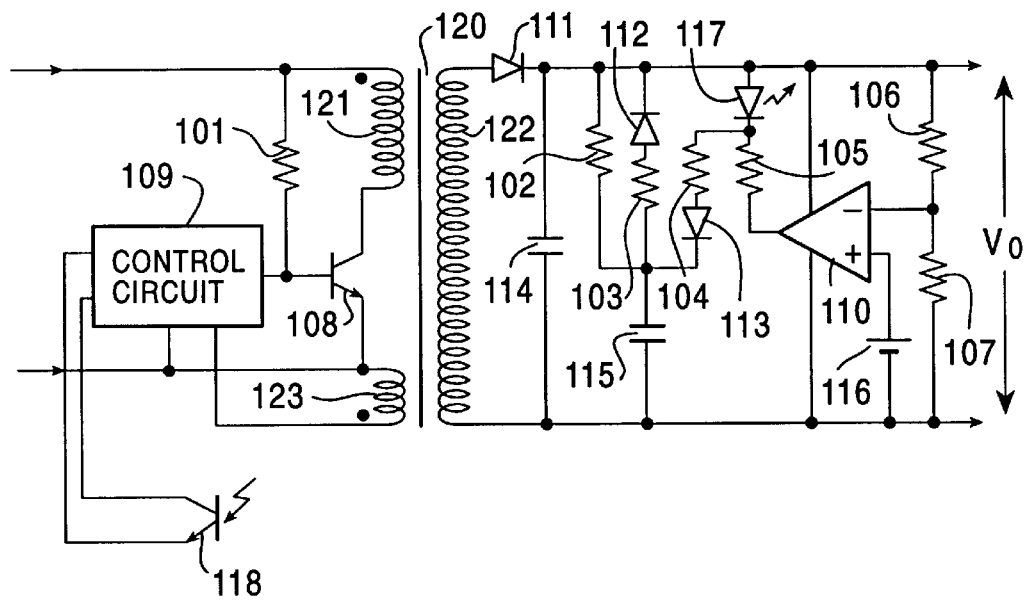
FIG. 5A shows a circuit diagram of the circuit configuration of the soft start circuit disclosed in Japanese Patent Application Laid-open No. 61-177163 (1986).
Figure 5B:
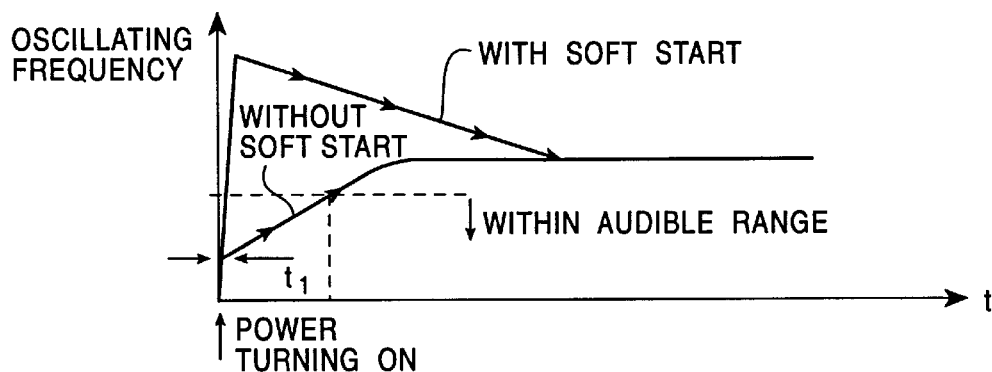
FIGS. 5B and 5C show a comparison of the properties of such soft start circuit with those of a conventional one.
Figure 5C:
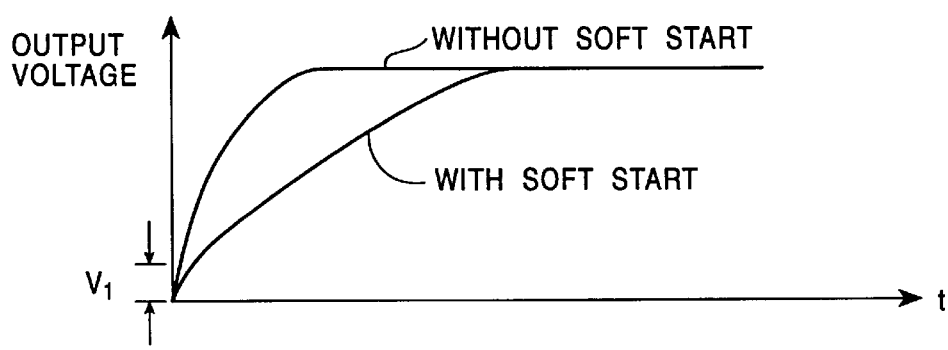

The driving circuit 5 comprises a driving voltage control circuit 7 and a step-up circuit 8. The driving voltage control circuit 7 includes an envelope generating circuit 18. That is, the present invention is a combination of the driving voltage control circuit 70 of FIG. 4 disclosed in Japanese Patent Application Laid-open No.9-107684 (1997) and the envelope generating circuit 18. The present invention aims at the suppression of the frequency components greatly apart away from a resonance frequency contained in the driving waveform of the piezoelectric transformer 1 during the brightness adjusting period according to the PWM system. The present invention also aims at the prevention of the parasitic oscillation of the piezoelectric transformer 1 and at the same time aims at the reduction of the generation of the audible sound of such transformer 1 and the support mechanism 25 (see FIG. 1).

Figure 7:
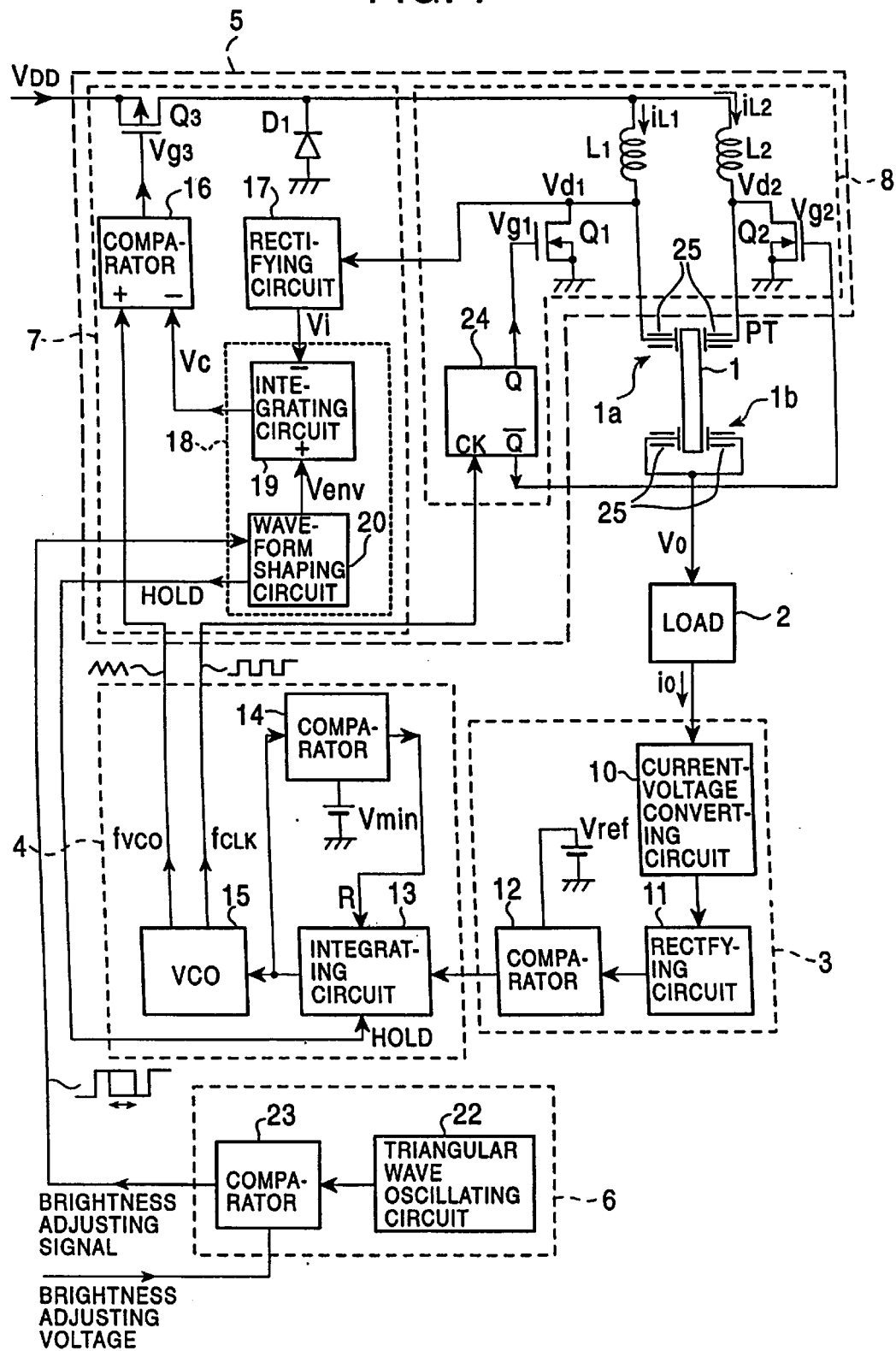
FIG. 7 shows a detailed diagram of the circuit configuration of FIG. 6.

The configuration and the operation of each circuit block will be described more in detail with reference to FIG. 7.

The load current comparing circuit 3 comprises a current-voltage converting circuit 10, a rectifying circuit 11 and a comparator 12. The load current $i_o$ supplied to the load current comparing circuit 3 is converted into an AC voltage signal by means of the current-voltage converting circuit 10. The resulting AC voltage signal is rectified by the rectifying circuit 11 to obtain an DC voltage signal and sent to the comparator 12. Such DC voltage signal is compared with the reference voltage $V_{ref}$ in the comparator 12. When the DC voltage signal driven from the load current $i_o$ is higher than the reference voltage $V_{ref}$, the comparator 12 sends a signal for increasing the driving frequency of the piezoelectric transformer 1 to the frequency sweep oscillator 4. Conversely, when such DC voltage signal is lower than the reference voltage $V_{ref}$, the comparator 12 sends a signal for decreasing the driving frequency of the piezoelectric transformer 1 to the frequency sweep oscillator 4.

The frequency sweep oscillator 4 comprises an integrating circuit 13, a comparator 14 and a voltage control oscillator (hereinafter called VCO) 15. A signal from the comparator 12 in the load current comparing circuit 3 to the integrating circuit 13 is a binary signal for increasing and decreasing the driving frequency. The integrating circuit 13 converts the binary signal into an analog signal for changing the driving frequency continuously and sends it to the VCO 15 as a control signal. At the same time the integrating circuit 13 sends the control signal to the comparator 14.

When the control signal from the integrating circuit 13 to the VCO 15 becomes lower than the reference voltage $V_{min}$, the comparator 14 sends a reset signal to the integrating circuit 13 to increase the control signal for the VCO 15 to the maximum value. Therefore, when the driving frequency decreases down to the minimum frequency, the VCO 15 makes a high-speed sweep up to the maximum frequency by means of this circuit.

The VCO 15 is an oscillating circuit for outputting a frequency twice as high as the driving frequency in accordance with a control voltage from the integrating circuit 13. The VCO 15 outputs two signals, namely, a triangular wave $f_{VCO}$ and a rectangular wave $f_{CLK}$. The triangular wave $f_{VCO}$ is sent to the driving voltage control circuit 7, a internal block of the driving circuit 5 to control the driving voltage of the piezoelectric transformer 1. The rectangular wave $F_{CLK}$ is sent to the step-up circuit 8, an internal block of the driving circuit 5. Its frequency is divided into one half and each frequency becomes the driving pulses $V_{g1}$ and $V_{g2}$ having opposite phase with each other.

The driving circuit 5 generates an AC voltage in the form of a sine wave for driving the piezoelectric transformer 1 with the DC input voltage $V_{DD}$. It comprises the driving voltage control circuit 7 and the step-up circuit 8. The driving voltage control circuit 7 generates a constant driving voltage in spite of the fluctuation of the input voltage $V_{DD}$. The step-up circuit 8 generates a sine wave which has a width wider than that of the DC input voltage $V_{DD}$.

The step-up circuit 8 comprises a frequency dividing circuit 24, transistors $Q_1$, $Q_2$, and coils $L_1$, $L_2$. It divides the frequency of the rectangular wave $f_{CLK}$ generated by the VCO 15 of the frequency sweep oscillator 4 by means of the frequency dividing circuit 24. The resulting wave is used to switch the transistors $Q_1$, $Q_2$ alternatively in order to generate a half sine waves $V_{d1}$, $V_{d2}$ having different phases by means of the coils $L_1$, $L_2$. Such half sine waves are sent to two primary electrodes $1a$ of the piezoelectric transformer 1. They functions as sine waves equivalently. The piezoelectric transformer 1 sends the output voltage $V_O$ to the secondary electrode $1b$ in accordance with the step-up ratio depending on the driving frequency and the impedance of the load 2.

The driving voltage control circuit 7 comprises the comparator 16, the rectifying circuit 17, the integrating circuit 19 and the waveform shaping circuit 20. The integrating circuit 19 and the waveform shaping circuit 20 constitutes the envelope generating circuit 18. The driving voltage control circuit 7 receives the driving voltage $V_{d1}$ from the transformer 1 and converts it into a DC voltage $V_i$ in the rectifying circuit 17. A constant voltage $V_H$ is applied to a non-inversion point of the integrating circuit 19 during the operation period excluding the turning off time of the brightness adjusting period. The integrating circuit 19 integrates the difference between said DC voltage $V_i$ and said constant voltage $V_H$ and sends the resulting integrated value to the comparator 16 as an output voltage $V_c$. The comparator 16 receives the triangular wave $t_{VCO}$ having a frequency twice as high as the driving frequency from the VCO 15 of the frequency sweep oscillator 4. The switching duty of the transistor $Q_3$ changes according to the voltage $V_c$.

Figure 9:
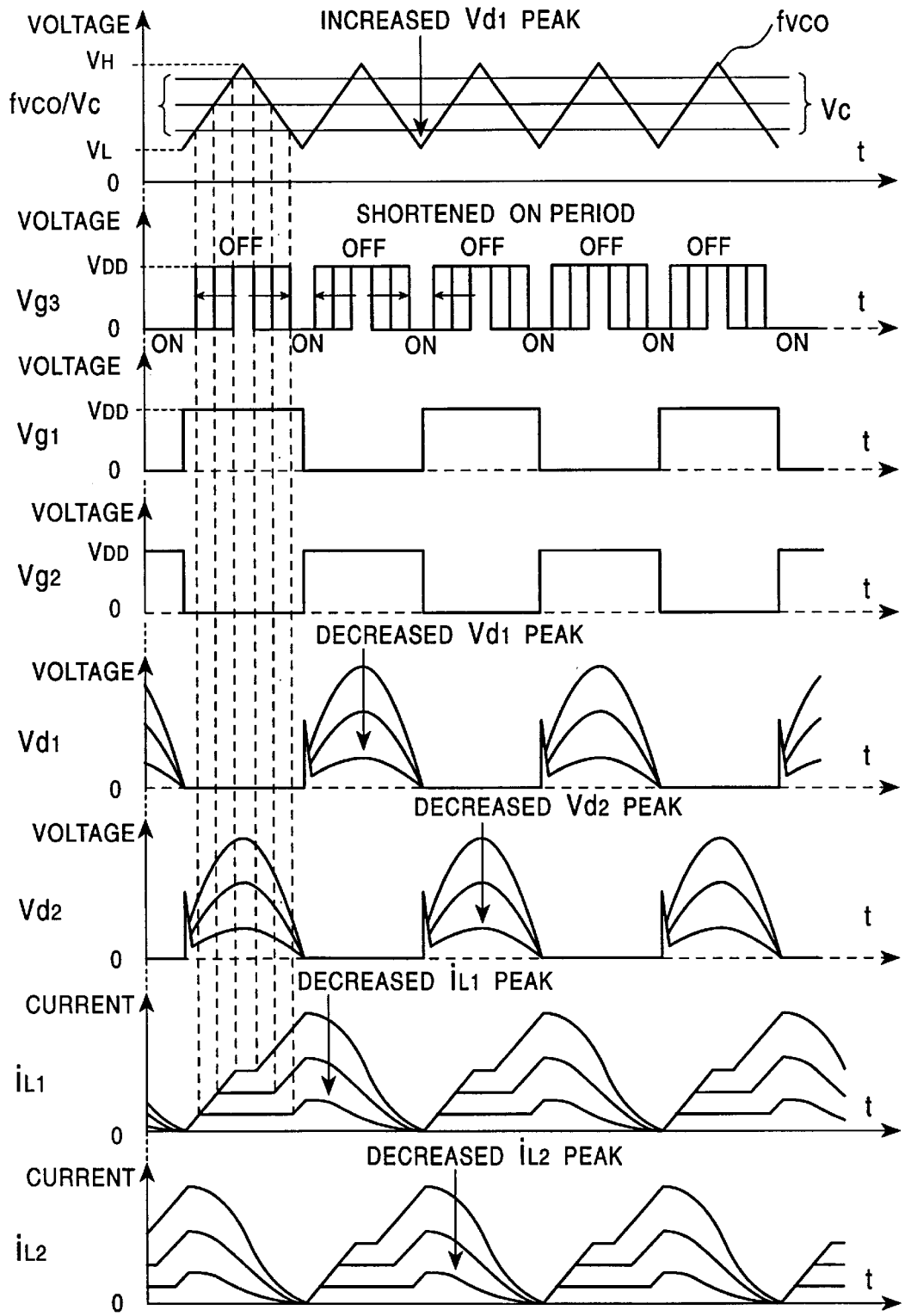
FIG. 9 shows a timing chart of the control operation of the driving voltage control circuit.

The above-mentioned operation will be described with reference to the timing chart shown in FIG. 9. The triangular wave $f_{VCO}$ changes between the voltage $V_L$ and the voltage $V_H$. FIG. 9 shows the waveforms at three stages, namely, when the output voltage $V_c$ is high, middle and low. When the output voltage $V_c$ of the integrating circuit 19 is lower than the voltage of the triangular wave $f_{VCO}$, the output voltage of $V_{g3}$ of the comparator 16 is 0 (zero) and the transistor $Q_3$ is turned on. For example, while the transistor $Q_3$ is turned on, the current $i_{L1}$ flows through the coil $L_1$. Such current is expressed by the equation given below.

$$i_{(t)} = V_{DD} \times t / L_1$$

That is, the current $i_{L1}$ increases in proportion to the time t. When the transistor $Q_3$ is turned off, the current flows through the coil $L_1$ from the earth via the diode $D_1$ in the driving voltage control circuit 7. This current is kept constant. When the transistor $Q_3$ is turned on again, the current flowing through the coil $L_1$ increase again in proportion to the time t. When the transistor $Q_3$ is turned off, the current energy stored in the coil $L_1$ is released as the voltage energy. The piezoelectric transformer 1 is expressed as an electric equivalent circuit in FIG. 1B. Such transformer is set so that it outputs a voltage resonance waveform chiefly depending on the coil $L_1$ and the input capacity $C_{d1}$ of the transformer 1. The driving voltage $V_{d1}$ becomes a half sine wave.

The peak value of the driving voltage $V_{d1}$ is proportional to the charge current of the coil $L_1$. Therefore, such peak value increases in proportion to the duration of the turning on period of the transistor $Q_3$. When the voltage $V_{d1}$ increases, the output voltage $V_i$ of the rectifying circuit 17 increases, and the output voltage $V_c$ of the integrating circuit 19 decreases. In this case, the duration of the low level of the voltage $V_{g3}$ to be sent to the comparator 16 becomes shorter. Under this condition, the duration of the turning on period of the P channel transistor $Q_3$ decreases. Therefore, the peak value of the coil current decreases and the driving voltage $V_{d1}$ decreases and is kept at a constant value. As described above, the driving voltage of the piezoelectric transformer 1 does not change in spite of the change of the input voltage $V_{DD}$.

Next, the brightness adjusting operation will be described below. When the brightness adjusting voltage is maximal, the circuit shown in FIG. 7 drives the piezoelectric transformer 1 and the output current flows through the cold cathode ray tube as the load 2 continuously. The brightness adjusting circuit 6 comprises a triangular wave oscillator 22 which generates a frequency of a comparatively low period (for example, 210 Hz) and a comparator 23. With the decrease of the brightness adjusting voltage, the output from the comparator 23 always changes from a low level signal to a brightness adjusting signal whose high level duty increases gradually. This brightness adjusting signal is sent to the envelope generating circuit 18 of the driving voltage control circuit 7.

Figure 8:
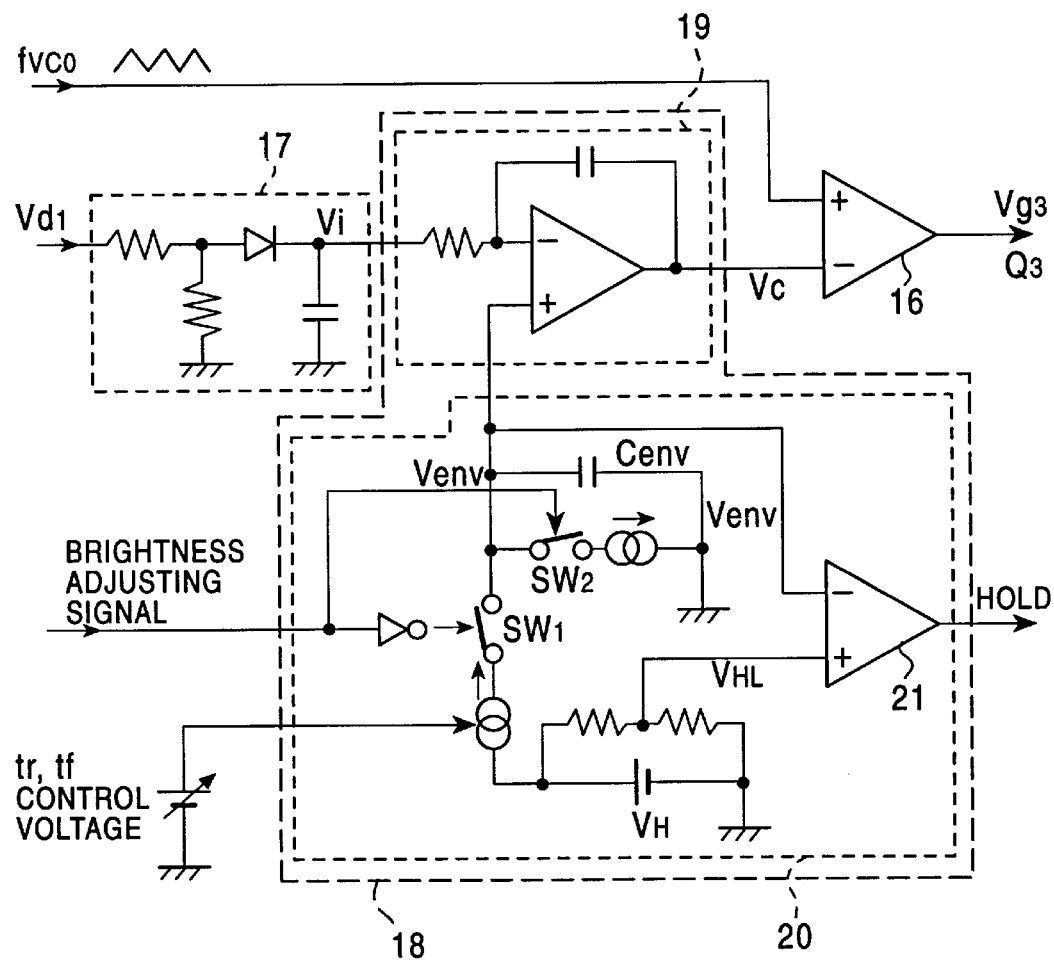
FIG. 8 shows a detailed circuit diagram of the envelope generating circuit of FIG. 7.

FIG. 8 shows a detailed circuit diagram of such envelope generating circuit 18. The envelope generating circuit 18 comprises an integrating circuit 19 and a waveform shaping circuit 20. The brightness adjusting signal from the brightness adjusting circuit 6 is sent to the waveform shaping circuit 20. When the brightness adjusting signal level is low, the capacitor $C_{env}$ is charged with the reference voltage $V_H$ from a constant current source. When the brightness adjusting signal level becomes high, switches $SW_1$ and $SW_2$ are changed over so that the capacitor $C_{env}$ discharges through the constant current source. The voltage $V_{env}$ of the capacitor $C_{env}$ is coupled with a non-inversion input point of the integrating circuit 19. When the voltage $V_{env}$ inputted to the non-inversion input point of the integrated circuit 19 from the waveform shaping circuit 20 becomes 0 potential, following acts are generated. The voltage $V_i$ inputted to a inversion input point of the integrated circuit 19 is rectified voltage of the driving voltage $V_{d1}$ for driving the piezoelectric transformer 1 and when the driving voltage $V_{d1}$ is higher than 0 potential, the output voltage $V_c$ of the integrated circuit 19 decreases gradually with time thereby a low-level period of the output voltage $V_{g3}$ of the comparator 16 is shortened and a period when the transistor $Q_3$ is turned on is shortend. When the voltage $V_i$ becomes finally 0 potential as the result of decreasing of the driving voltage $V_{d1}$, the output voltage $V_c$ of the integrated circuit 19 is stablized as a equivalent to the lowest voltage level $V_L$ of the triangle waive $f_{VCO}$ outputted by $V_{CO}$ 15 shown in FIG. 9. Namely, the integrated circuit 19 is controlled so that the voltage $V_{env}$ inputted to the non-inversion input point becomes equal to the voltage $V_i$ inputted to the inversion input point. That is what is called imaginary short condition. As a result, the output voltage $V_i$ of the rectifying circuit 17 is so controlled that such voltage becomes equal to the voltage $V_{env}$. Therefore, the voltage $V_c$ from the integrating circuit 19 follows the waveform of the $V_{env}$, and the driving voltages $V_{d1}$ and $V_{d2}$ of the piezoelectric transformer are modulated with the voltage waveform of the capacitor $C_{env}$.

The comparator 21 of the envelope generating circuit 18 divides the reference voltage $V_H$ by means of a resistor. It sends a voltage $V_{HL}$ which is slightly lower than the voltage $V_H$ to the non-inversion input point. It also applies an inverted input to the capacitor $C_{env}$. As a result, the comparator 21 sends a HOLD signal to the integrating circuit 13 in the frequency sweep oscillator 4 for a period from the time when the voltage $V_{env}$ lowers slightly and to the time when such voltage returns to its original value. The control voltage is held in the VCO15 in the frequency sweep oscillator 4. Therefore, the driving frequency is held while the output current $i_o$ does not flow. When the piezoelectric transformer 1 is driven again, it operates at its frequency.

Figure 10:
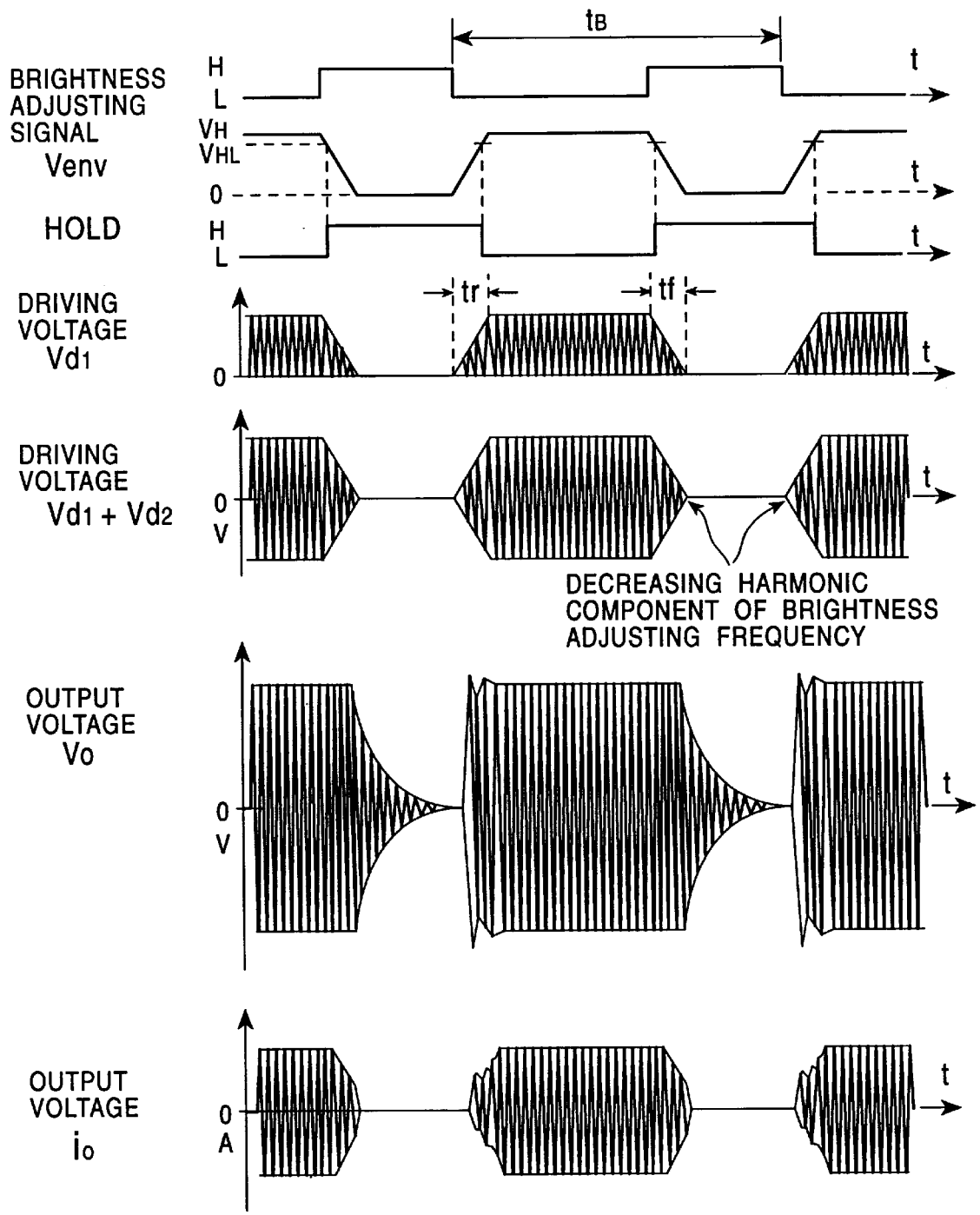
FIG. 10 shows a diagram of the operation waveform of the driving voltage, output voltage and output current for describing the control by means of the envelope generating circuit.
Figure 11:
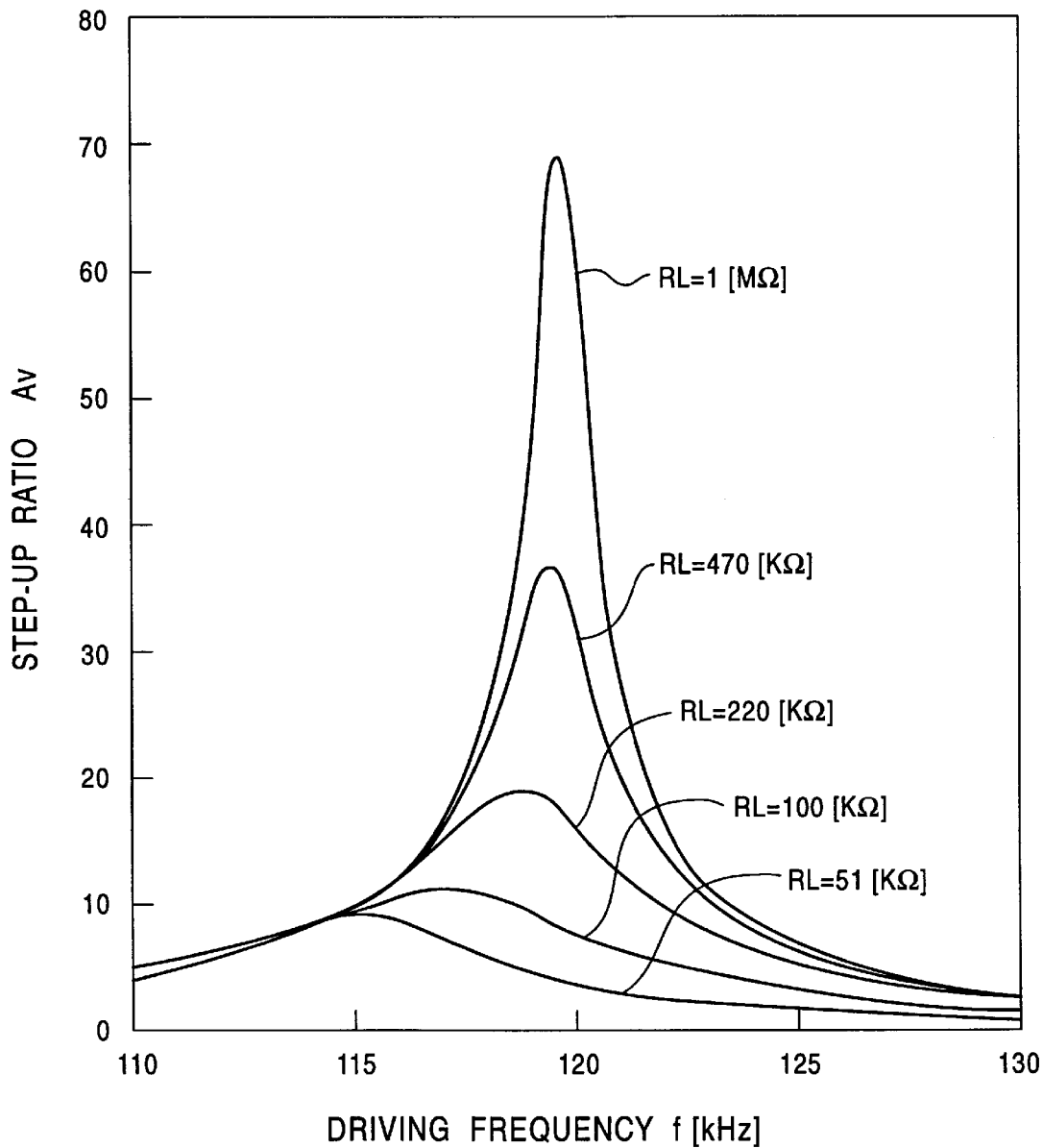
FIG. 11 shows a frequency characteristic of a step-up ratio by load impedance of the piezoelectric transformer.

FIG. 10 shows the operation waveform above described. When the brightness adjusting signal level is low, the driving voltage $V_{d1}$ is outputted at a constant level to drive the transformer 1. When the brightness adjusting signal level becomes high, the $SW_1$ is turned off and the switch $SW_2$ is turned on. Therefore the voltage $V_{env}$ goes down to the ground potential after being discharged at a constant current level. When the brightness adjusting signal level becomes low, the $SW_1$ is turned on and the switch $SW_2$ is turned off, and the capacitor $V_{env}$ is charged up to the reference voltage $V_H$ from the constant current source. As described above, the voltage $V_{env}$ of the capacitor $C_{env}$ becomes a trapezoidal wave. The driving voltages $V_{d1}$, $V_{d2}$ of the transformer 1 are modulated into the envelope of such trapezoidal wave. As a result, the output voltage $V_O$ of the transformer 1 rises gradually and its overshoot decreases. The output current $i_o$ shows the same change.

The rise time $t_r$ and the fall time $t_f$ of the trapezoidal wave are expressed in terms of the current value $I_c$ of the constant current source, the capacitor capacity $C_{env}$ and the reference voltage $V_H$ as represented by the equation given below.

$$t_r, t_f = C_{env} \times V_H / I_c$$

The time, $t_r$, $t_f$ is a period when the driving voltage to the piezoelectric transformer 1 increases and decreases gradually. As a result, the band of the driving frequency applied to the transformer 1 is limited, so the parasitic oscillation of the transformer 1 is suppressed and the production of the audible sound of the transformer 1 and the support mechanism 25 can be reduced.

As described above, if the rise time $t_r$ and the fall time $t_f$ are set longer by increasing the brightness adjusting period within a range where the eye cannot recognize flickering, it is possible to decrease the harmonic component of the brightness adjusting frequency contained in the driving frequency of the piezoelectric transformer and to prevent the parasitic oscillation of the transformer 1. If the rise time $t_r$ and the fall time $t_f$ are set too long for the brightness adjusting period $t_B$, the brightness adjusting range becomes narrow, so they should be set to the values at which the audible sound of the transformer 1 is hardly heard.

One embodiment of the present invention will be described with reference to FIG. 7.

In the case of the present embodiment, a piezoelectric transformer 1 is driven within a frequency range from 115–120 kHz. A cold cathode fluorescent lamp 2 of 220 mm in length and 3 mm in diameter operates at a step-up ratio $A_v$ of about 10.

The transformer 1 is driven with a two-phase half sine wave of 60V in peak voltage at the primary electrode 1a. Such half sine wave corresponds to a driving voltage of 120$V_{p-p}$. In this case, the transformer 1 can be operated with the input voltage $V_{DD}$ higher than 15V. If an autotransformer with a winding ratio of 1:2 is used as a step-up circuit 8, it is possible to operate the transformer 1 with the input voltage $V_{DD}$ higher than 7V. The uppermost limit of the input voltage is restricted with the withstand voltage of a circuit elements. Twenty volts will do for the uppermost limit.

The frequency sweep oscillator 4 can sweep a frequency range of 110–130 kHz covering a resonance frequency of the piezoelectric transformer 1. For the brightness adjusting circuit 6, a frequency higher than 60 kHz which does not give flickering to the eye is used. Such frequency should be apart from the integral multiples of the vertical frequency of a color liquid crystal display panel to be used by more than ±10 Hz to prevent the generation of an interference noise. For example, if such vertical frequency is 59.94 Hz, it is possible to use 210 Hz as the brightness adjusting frequency of the brightness adjusting circuit 6.

When a frequency range covering about 500 $\mu$s–2 ms is set for the rise time $t_r$ and the fall time $t_f$ of the envelope generating circuit 18, and it is still necessary to reduce the audible sound, the brightness adjusting frequency should be set at 150 Hz and the rise time $t_r$ and the fall time $t_f$ should be increased in order to avoid a problem that the brightness adjusting range becomes narrow.

FIG. 8 shows an example of a circuit employing a trapezoidal wave in an waveform shaping circuit 20. This circuit uses two constant current sources and a capacitor $C_{env}$. Use of a current mirror circuit as the constant current source makes it possible to change the rise time $t_r$ and the fall time $t_f$ by the control voltage. That is, when it is not necessary to change the configuration of such circuit, it is preferable to use a current mirror circuit because it can be easily incorporated in an IC.

Another embodiment of the present invention will be described below. In the case of the above-mentioned embodiment, a trapezoidal wave was used as an envelope waveform. However, in the case of the present embodiment, an exponential function waveform is used as an envelope waveform. At the same time, a step-up circuit and an envelope circuit are modified to increase insufficient step-up ratio of a piezoelectric transformer 1.

Figure 2:
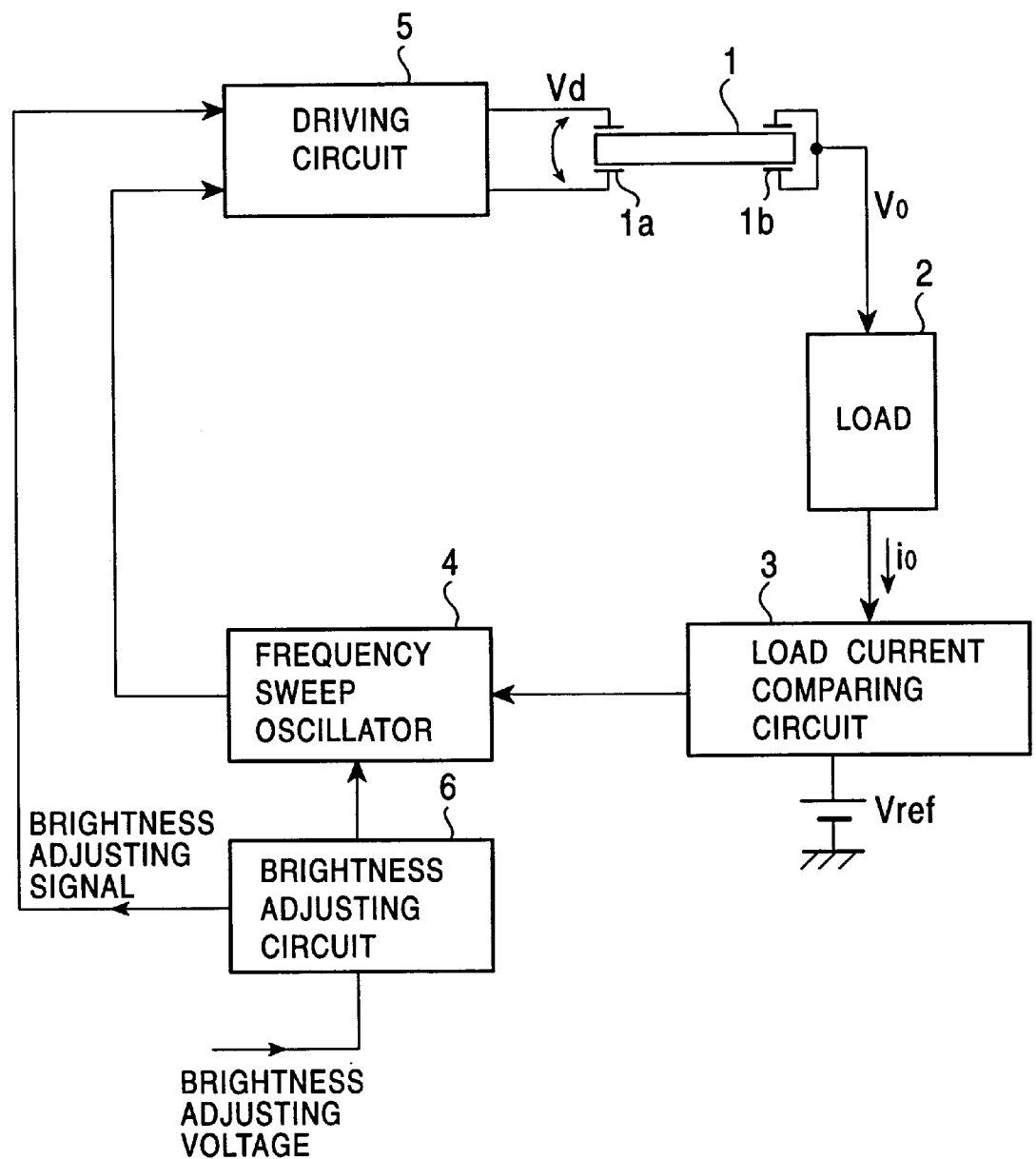
FIG. 2 shows a block diagram of the circuit configuration for driving the piezoelectric transformer disclosed in Japanese Patent Application Laid-open No.8-107678 (1996).
Figure 3:
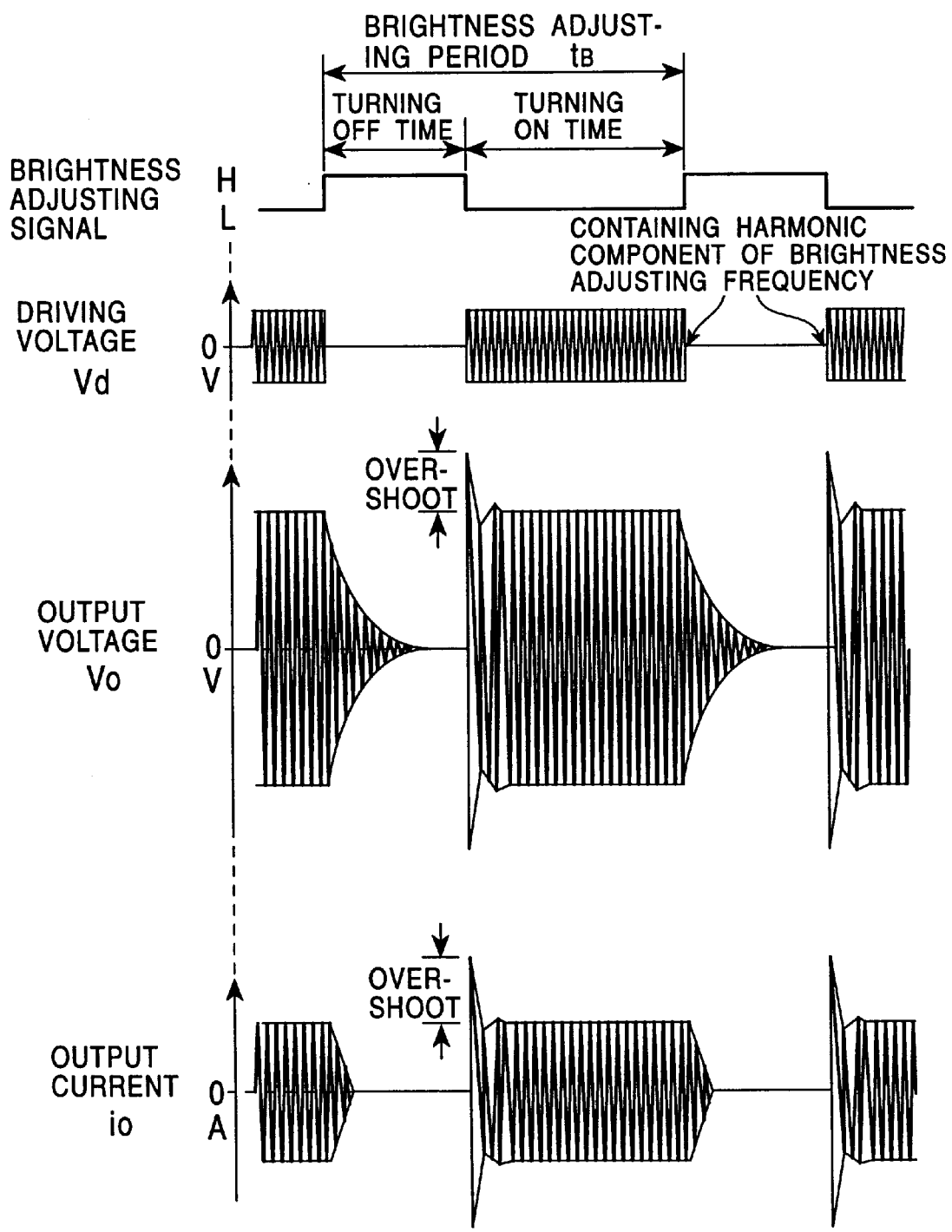
FIG. 3 shows an operation waveform of the brightness adjusting method using the circuit configuration of FIG. 2.
Figure 12:
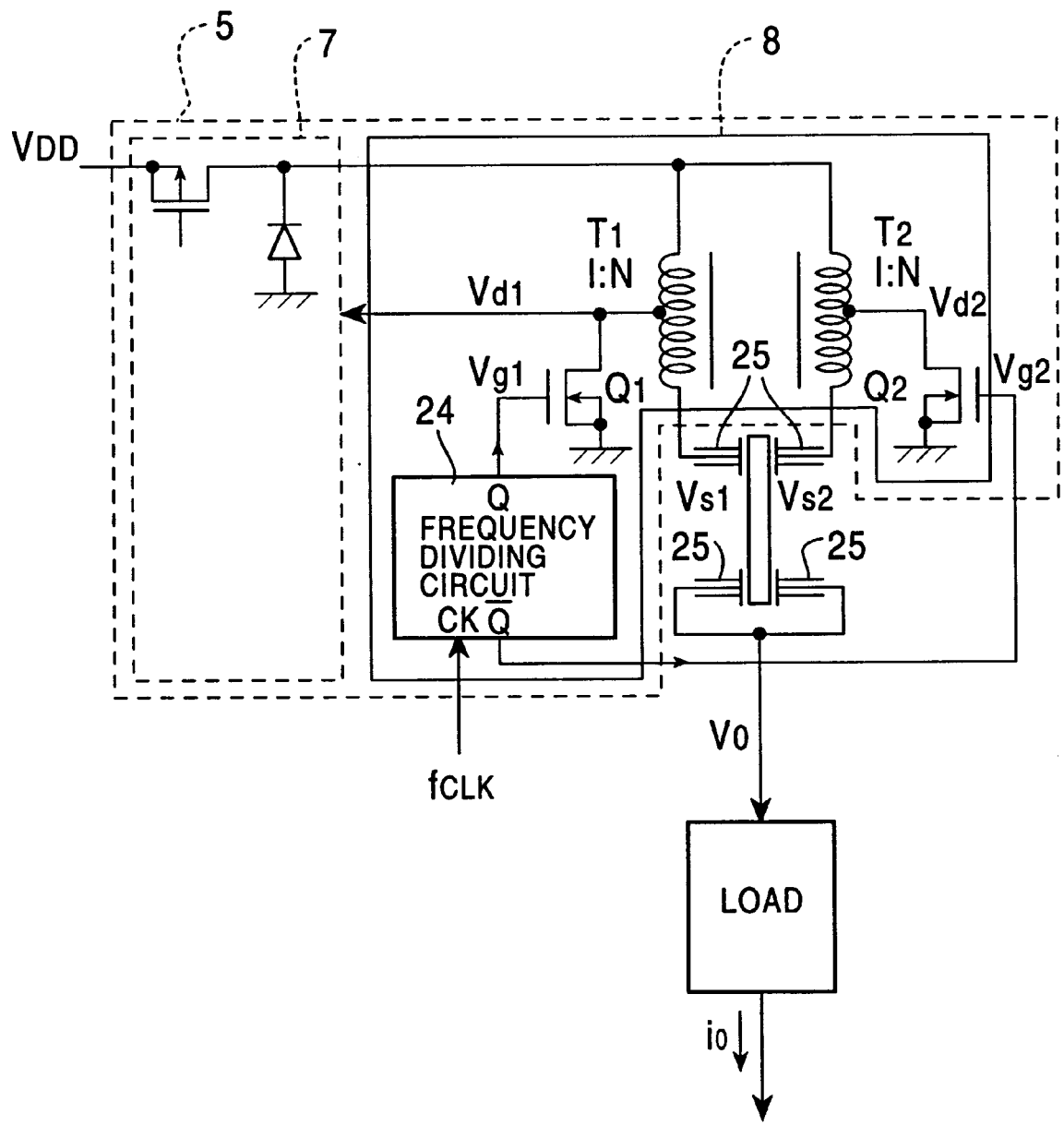
FIG. 12 shows a circuit diagram of a step-up circuit configuration of another embodiment of the present invention.

FIG. 12 shows a circuit diagram of the step-up circuit 8 used in the present embodiment. In this figure, the coils $L_1$, $L_2$ in the step-up circuit 8 shown in FIG. 2 are replaced by electromagnetic transformers $T_1$, $T_2$. The voltage resonance waveforms $V_{d1}$, $V_{d2}$ generated by the transistors $Q_1$, $Q_2$ are the voltages $V_{s1}$, $V_{s2}$ proportional to the winding ratio (N+1) of the secondary windings of the electromagnetic transformers $T_1$, $T_2$. Therefore, the insufficient step-up ratio of the piezoelectric transformer 1 can be compensated with the electromagnetic transformers $T_1$, $T_2$, so lower voltage operation becomes possible.

Figure 13:
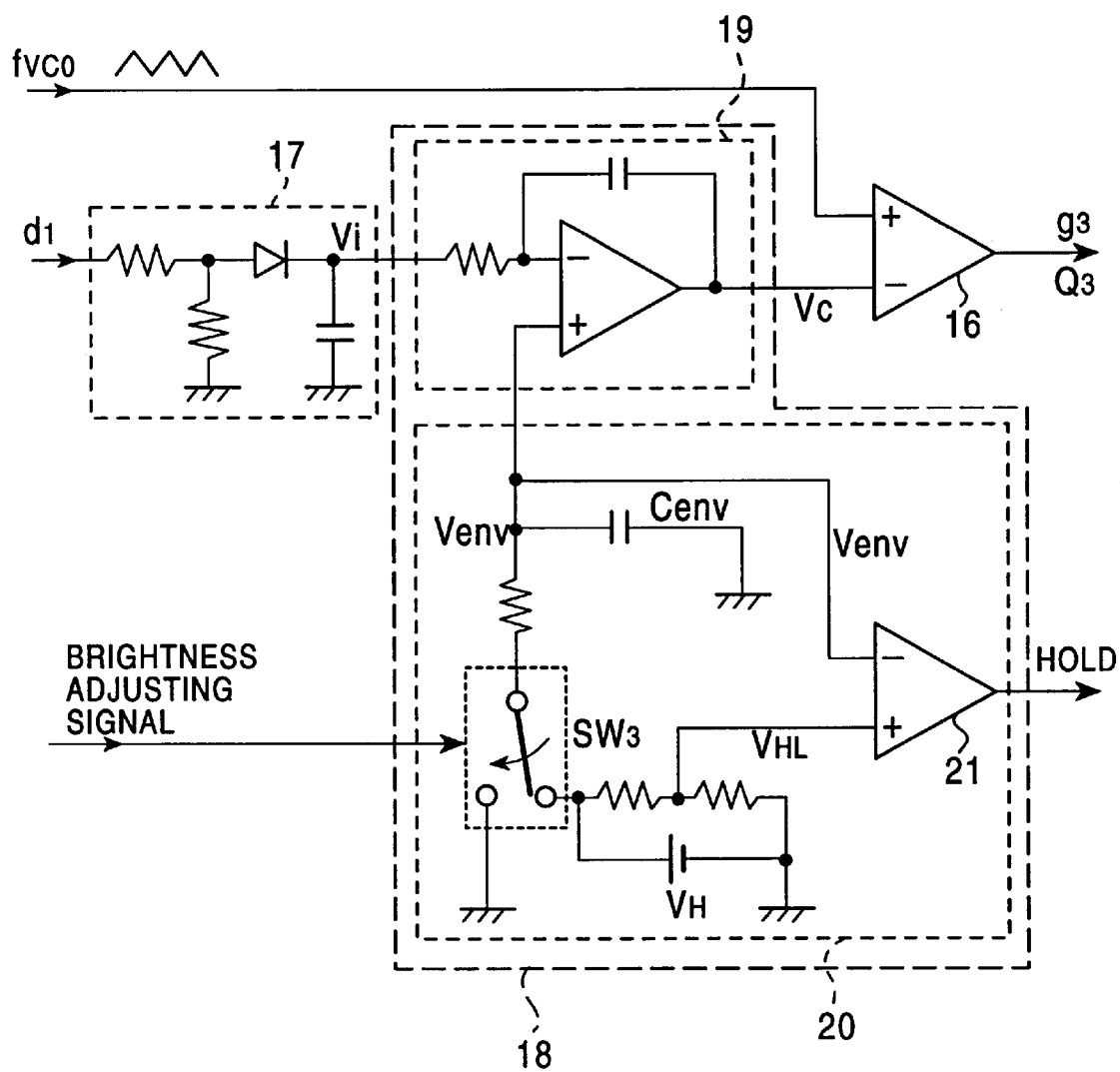
FIG. 13 shows a circuit diagram of the envelope generating circuit configuration of another embodiment of the present invention.
Figure 14:
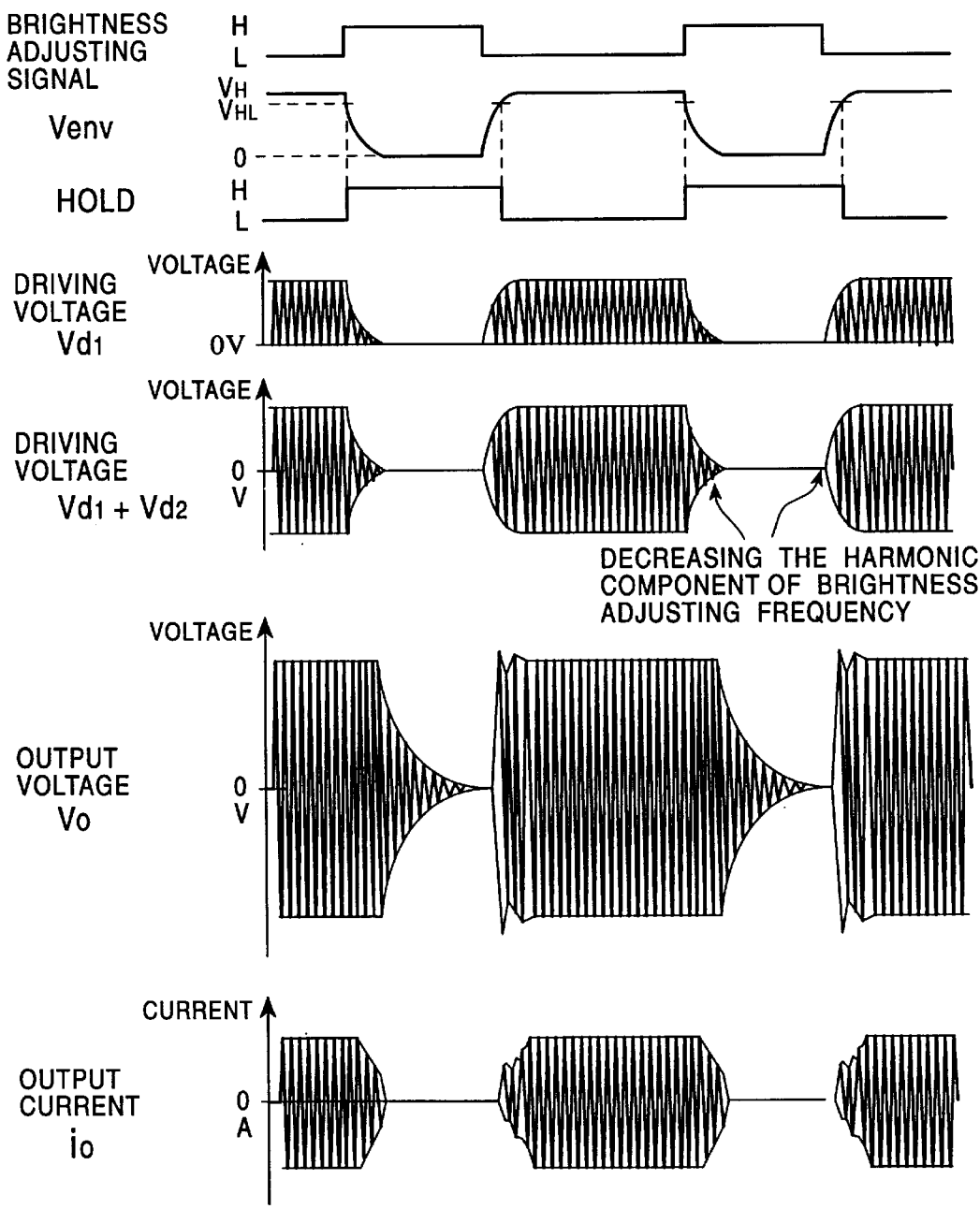
FIG. 14 shows a diagram of the operation waveform of the driving voltage, output voltage and output current for describing the control by means of the envelope generating circuit of FIG. 13.

FIG. 13 shows a circuit diagram of the envelope generating circuit 18 employed in the present embodiment. In FIG. 13, the envelope generating circuit 18 is an example of a circuit for generating an exponential function envelope waveform by means of resistor(s) and capacitor(s). In this circuit, a capacitor $C_{env}$ is charged and discharged through the resistor(s). In the case of this waveform shaping circuit 20, the envelope waveform is an exponential function waveform according to the time constant of said resistor and capacitor. Therefore, the harmonic component of the brightness adjusting frequency can be removed. FIG. 14 shows an operation waveform when such exponential function envelope waveform is used. If the natural oscillation frequency of the support mechanism 25 shown in FIG. 12 is set to a frequency having no mechanical resonance frequency corresponding to the multiples and multiple quotients of the driving frequency of the piezoelectric transformer 1, the parasitic vibration of the transformer 1 can be prevented by the envelope generating circuit 18. As a result, the audible sound can be prevented. Since the vibration of the nodes of the transformer 1 is suppressed, it is no longer necessary to employ a conventional conductive wire with excellent flexibility etc. as the support mechanism 25 for the connection with the electrodes of the transformer 1. That is, the transformer 1 can be secured by means of a spring. Therefore, a transformer package equipped with top and bottom springs for retaining may be used, eliminating any welding and soldering operations for the transformer electrodes.

Figure 15:
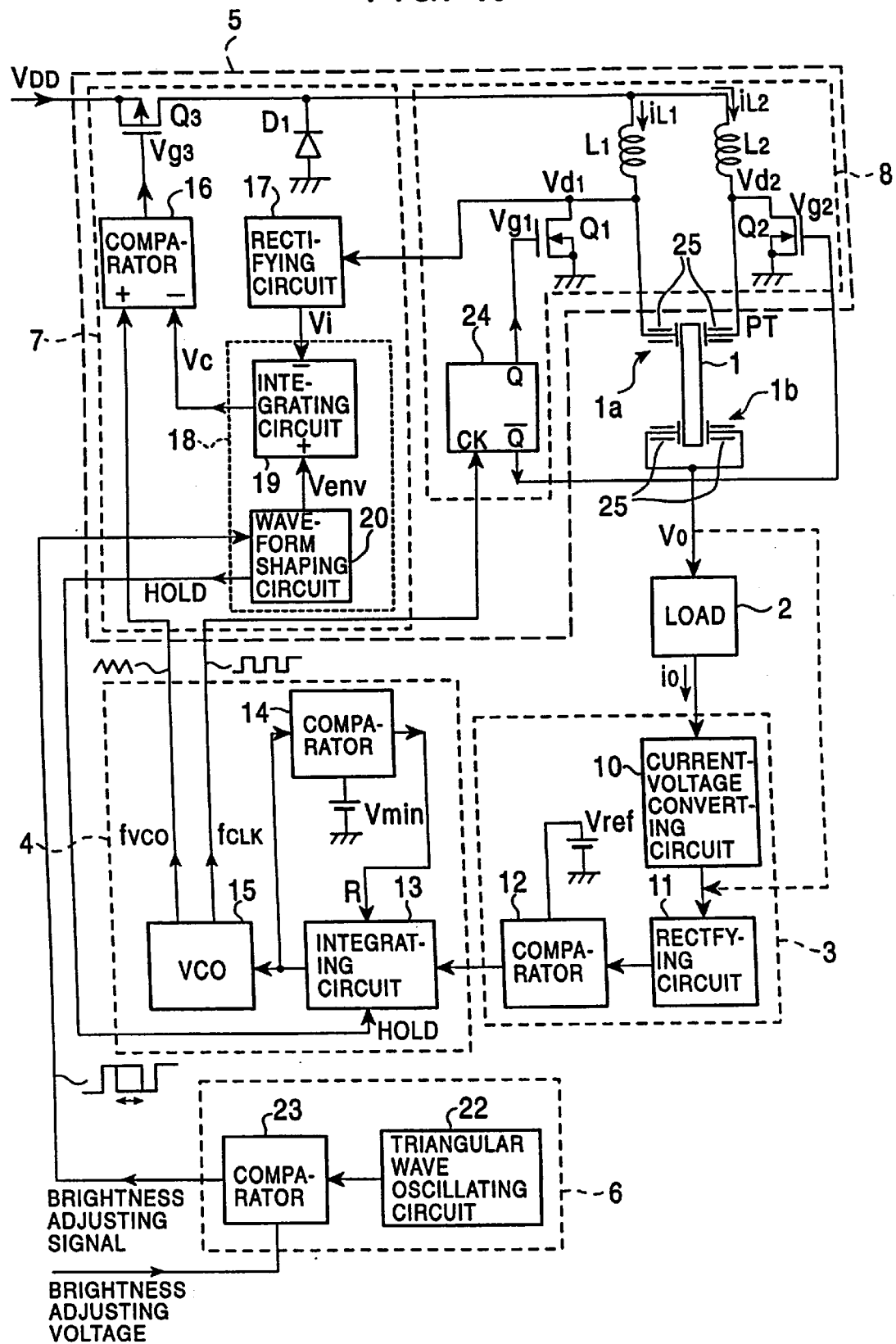
FIG. 15 shows a detailed diagram of the circuit configuration of FIG. 6 in which the piezoelectric transformer outputs a constant voltage.

All of the above-mentioned embodiments of the present invention are inverters in which the secondary output of the piezoelectric transformer 1 is applied as a constant current to the load 2. However, it is possible to design the transformer so that it can output a constant voltage instead of a constant current, if so desired. In such case, as indicated by a broken line with an arrow at its head from the secondary electrode 1b to a rectifying circuit 11 in FIG. 15, the output voltage of the transformer 1 is applied to the rectifying circuit directly so as to compare such output voltage with the reference voltage $V_{ref}$ directly.

In the above-mentioned embodiments, the cold cathode fluorescent lamp is used as the backlight for the color liquid crystal display panel as the load of the inverter and its brightness is adjusted. However, the present invention is not limited to these embodiments. From the above description, it will be clear that the present invention may be applied to any inverter in which a piezoelectric transformer is driven with the PWM system and the same effects can be obtained.

What we claim is:

1. A method for driving a piezoelectric transformer-inverter with a pulse width modulation system, the method comprising the steps of:

time-dividing a waveform having a first frequency with a binary pulse of a second frequency which is lower than the first frequency to generate a driving voltage waveform for driving a piezoelectric transformer; and modulating said driving voltage waveform to suppress a harmonic component of said second frequency component contained in said first frequency component by decreasing a slope of an envelope of said driving voltage waveform to thereby control parasitic oscillation of the piezoelectric transformer.

2. A method for driving a piezoelectric transformer-inverter according to claim 1, wherein a trapezoidal wave is used as an envelope waveform of said driving voltage.

3. A method for driving a piezoelectric transformer-inverter according to claim 1, wherein an exponential function wave is used as an envelope waveform of said driving voltage.

4. A control circuit of a piezoelectric transformer-inverter, comprising:

a driving circuit for driving a piezoelectric transformer with an AC voltage of a first frequency derived from a DC voltage externally supplied;

a frequency sweep oscillator for generating a driving frequency for said driving circuit;

a load current comparing circuit for comparing an output current from said piezoelectric transformer with a reference value to increase or decrease the driving frequency generated by said frequency sweep oscillator based on the comparison; and a duty variable pulse oscillator for time-division driving said transformer with a time-divided driving voltage waveform having a second frequency, wherein said driving circuit comprises an envelope generating circuit for decreasing the slope of an envelope of the time-divided driving voltage waveform to suppress a harmonic component of said second frequency component contained in said first frequency to thereby control parasitic oscillation of the piezoelectric transformer, and said piezoelectric transformer is driven by the driving voltage modulated in said envelope generating circuit.

5. A circuit for controlling a piezoelectric transformer-inverter according to claim 4, wherein a trapezoidal wave is used as an envelope waveform of the driving voltage of the piezoelectric transformer generated by said envelope generating circuit.

6. A circuit for controlling a piezoelectric transformer-inverter according to claim 5, wherein said envelope generating circuit comprises a waveform shaping circuit for generating a trapezoidal wave by a constant current charge and discharge of a capacitor and an integrating circuit, wherein a trapezoidal wave generated by said waveform shaping circuit is modulated in said integrating circuit into said driving voltage of the first frequency.

7. A circuit for controlling a piezoelectric transformer-inverter according to claim 6, wherein a current mirror circuit is used as a constant current source for charging and discharging said capacitor in said envelope generating circuit.

8. A circuit for controlling a piezoelectric transformer-inverter according to claim 4, wherein an exponential function wave is used as an envelope waveform of the driving voltage of the piezoelectric transformer generated by said envelope generating circuit.

9. A circuit for controlling a piezoelectric transformer-inverter according to claim 8, wherein said envelope generating circuit comprises a waveform shaping circuit for generating an exponential wave by a resistor and a capacitor and an integrating circuit, wherein an exponential wave generated by said waveform shaping circuit is modulated in said integrating circuit into said driving voltage of the first frequency.

10. A piezoelectric transformer-inverter comprising:

a piezoelectric transformer which outputs an AC voltage applied to a primary side to a secondary side using piezoelectric effect; and a control circuit comprising:

a driving circuit for driving a piezoelectric transformer with an AC voltage of a first frequency derived from a DC voltage externally supplied;

a frequency sweep oscillator for generating a driving frequency for said driving circuit;

a load current comparing circuit for comparing an output current from said piezoelectric transformer with a reference value to increase or decrease the driving frequency generated by said frequency sweep oscillator based on the comparison; and a duty variable pulse oscillator for time-division driving said transformer with a time-divided driving voltage waveform having a second frequency, wherein said driving circuit comprises an envelope generating circuit for decreasing the slope of an envelope of the time-divided driving voltage waveform to suppress a harmonic component of said second frequency component contained in said first frequency to thereby control parasitic oscillation of the piezoelectric transformer, and said piezoelectric transformer is driven by the driving voltage modulated in said envelope generating circuit.

11. A piezoelectric transformer-inverter according to claim 10, wherein said piezoelectric transformer comprises a support mechanism for supporting vibration nodes of said piezoelectric transformer, wherein said support mechanism has a resonance frequency apart from integral multiples and integral quotients of a first frequency for driving said piezoelectric transformer.

* * * * *